United States Patent
Lam et al.

(10) Patent No.: US 11,243,393 B2
(45) Date of Patent: Feb. 8, 2022

(54) DEVICE AND METHOD FOR TREATING LENSES

(71) Applicant: Plasmatica Ltd., Moshav Beni Atarot (IL)

(72) Inventors: Amnon Lam, Kibbutz Givat Oz (IL); Adam Sagiv, Bnei Atarot (IL)

(73) Assignee: PLASMATICA LTD., Moshav Beni Atarot (IL)

( * ) Notice: Subject to any disclaimer, the term of this patent is extended or adjusted under 35 U.S.C. 154(b) by 0 days.

(21) Appl. No.: 17/079,744

(22) Filed: Oct. 26, 2020

(65) Prior Publication Data

US 2021/0041690 A1 Feb. 11, 2021

Related U.S. Application Data (63) Continuation-in-part of application No. 16/493,322, filed as application No. PCT/IL2018/050304 on Mar. 15, 2018, now Pat. No. 10,820,402.

(Continued)

(51) Int. Cl.
*H01J 37/32* (2006.01)
*G02B 27/00* (2006.01)
*H05H 1/24* (2006.01)

(52) U.S. Cl.
CPC .... *G02B 27/0006* (2013.01); *H01J 37/32403* (2013.01); *H01J 37/32541* (2013.01); *H05H 1/2406* (2013.01); *H05H 1/2418* (2021.05)

(58) Field of Classification Search
CPC ............ G02B 27/0006; H01J 37/32403; H01J 37/32541; H05H 1/2406; H05H 1/2418
See application file for complete search history.

(56) References Cited

U.S. PATENT DOCUMENTS 4,245,154 A * 1/1981 Uehara ............. H01J 37/32935
204/192.32
4,827,870 A 5/1989 Lee
(Continued)

FOREIGN PATENT DOCUMENTS

CN 105204180 12/2015
EP 1867683 12/2007
(Continued)

OTHER PUBLICATIONS

International Search Report of Application No. PCT/IL2018/050304 dated Jul. 19, 2018.
(Continued)

*Primary Examiner* — Kurtis R Bahr
(74) *Attorney, Agent, or Firm* — Pearl Cohen Zedek Latzer Baratz LLP (57) ABSTRACT

A treatment device for treating a lens included in an operational device, is disclosed. The Device may include a first segmented electrode, comprising at least two segments electrically isolated from one another, located in proximity to a first surface of the lens, wherein the first surface is to be treated by the treatment device; at least one second electrode; a distributor electrically associated with the first segmented electrode and with the at least one second electrode, and configured to distribute RF energy from a single RF generator to each of the segments of the segmented electrode separately; an RF generator for separately providing RF energy to the segments of the at least one first electrode and the at least one second electrode in an amount sufficient to generate plasma on at least a portion of the first surface of the lens, and a controller functionally associated with the distributor.

8 Claims, 8 Drawing Sheets

Related U.S. Application Data (60) Provisional application No. 62/471,450, filed on Mar. 15, 2017.

(56) References Cited

U.S. PATENT DOCUMENTS

| | | | |
|---|---|---|---|
| 5,009,920 | A | 4/1991 | Lee |
| 5,211,759 | A * | 5/1993 | Zimmermann ....... C03C 17/001 118/723 R |
| 5,888,593 | A | 3/1999 | Petrmichi |
| 7,250,197 | B2 | 7/2007 | Rastogi |
| 7,999,173 | B1 | 8/2011 | Ashpis |
| 8,328,982 | B1 | 12/2012 | Babayan et al. |
| 9,575,218 | B2 | 2/2017 | Shim |
| 2004/0055632 | A1 | 3/2004 | Mazumder |
| 2005/0045589 | A1 | 3/2005 | Rastogi et al. |
| 2007/0078245 | A1 | 4/2007 | Hoffman |
| 2011/0283477 | A1 | 11/2011 | Ashpis |
| 2017/0047201 | A1 | 2/2017 | Legein et al. |
| 2019/0200851 | A1 * | 7/2019 | Chen ........................ A61B 1/07 |
| 2019/0391387 | A1 | 12/2019 | Neophytou |

FOREIGN PATENT DOCUMENTS

| | | |
|---|---|---|
| EP | 2115499 | 11/2009 |
| GB | 2286200 | 8/1995 |
| JP | 59024825 | 2/1984 |
| WO | WO 2017/153898 | 9/2017 |

OTHER PUBLICATIONS

EP Search Report dated Dec. 1, 2020 for corresponding application No. EP18767069.0.

* cited by examiner

DEVICE AND METHOD FOR TREATING LENSES

CROSS-REFERENCE TO RELATED APPLICATIONS

This application is a Continuation in Part of U.S. application Ser. No. 16/493,322, filed Sep. 12, 2019, which is a National Phase of PCT International Application No. PCT/IL2018/050304, International Filing Date Mar. 15, 2018, claiming the benefit of U.S. Provisional Patent Application No. 62/471,450, filed Mar. 15, 2017, which are hereby incorporated by reference.

TECHNICAL FIELD OF THE INVENTION

The invention relates to devices and methods for providing plasma treatments. In particular, the invention relates to devices and methods for providing plasma treatments of lenses.

BACKGROUND OF THE INVENTION

Images and videos taken by cameras, particularly cameras placed in external environment, such as surveillance cameras or car cameras (e.g., DVR cameras) are sensitive to the environmental conditions in the surroundings of the cameras. For example, fog and rain may blur the images and videos, making it almost impossible for the surveillance cameras to capture recognizable images or for car cameras to capture images that may allow controlling various functions of the car. In autonomic driving the quality of the images captured by the car camera(s) is an essential factor that may affect the safety of the person(s) in the car.

Additional devices such projectors and traffic lights are also sensitive to the environmental conditions. Fog, rain drops or snow can scatter the light produces by such devices and reduce their efficiency dramatically.

Accordingly, there is a need to find an effective method for reducing blur due to accumulation of droplets on a lens of the camera during fog, rain, snow or due to condensation of vapor. Most commonly used methods include coating the lenses with various hydrophilic coatings. These techniques are limited as the coating may degrade or be peeled with time.

SUMMARY OF EMBODIMENTS OF THE INVENTION

Some aspects of the invention may relate to devices and methods for providing plasma treatments of lenses. A treatment device for treating a lens included in an operational device, according to some embodiments of the invention may include: at least one first electrode located in proximity to a first surface of the lens, wherein the first surface is to be treated by the treatment device; at least one second electrode; and an RF generator electrically associated with the electrodes for providing RF energy to the at least one first and at least one second electrodes in an amount sufficient to generate plasma on the first surface of the lens.

In some embodiments, the lens may be located between the at least one first electrode and the at least one second electrode. In some embodiments, the first surface may be an external surface of the lens. In some embodiments, both the at least one first electrode and the at least one second electrode are located in proximity to the first surface of the lens.

In some embodiments, the device may further include an electrical isolator made from dielectric material located between the first and second electrode. In some embodiments, the dielectric material shields or covers at least a portion of one of: the at least one first electrode and the at least one second electrode. In some embodiments, the device may further include an actuator for simultaneously moving the first and second electrodes over at least the first surface of the lens. In some embodiments, the device may further include a controller configured to control the RF generator to provide RF energy to the first and second electrodes. In some embodiments, the controller may further be configured to control the actuator to synchronize the movement of the at least one first and the at least one second electrodes with the RF energy application.

In some embodiments, the device may further include a gas supply unit for supplying gas to a gap between the first surface of the lens and the first electrode. In some embodiments, the first electrode may be located at a distance of at most 2 mm from the external surface of the lens. In some embodiments, the second electrode is located at a distance of at most 2 mm from the internal surface of the lens. In some embodiments, the operational device may be at least one of: a camera, a traffic light and a projector.

In some embodiments, the device may further include at least one attachment element configured to attach the treatment device to the operational device. In some embodiments, the device may further include at least one of a wiper and a drier for drying the lens prior to the application of the RF energy.

Some aspects of the invention may be related to a method of treating a lens included in an operational device. In some embodiments, the method may include: activating an RF generator to provide RF energy to at least two electrodes when the operational device is operational; and generating plasma on at least the first surface of the lens. In some embodiments, the at least two electrodes may include: at least one first electrode located in proximity to a first surface of the lens, wherein the first surface is to be treated; and at least one second electrode.

In some embodiments, the method may include simultaneously moving the at least one first electrode and the at least one second electrode over the first surface while generating the plasma. In some embodiments, the method may include providing gas to be ionized onto the first surface of the lens. In some embodiments, the method may include forming plasma in a dielectric-barrier discharge (DBD) mode over the first surface of the lens.

Some additional aspects of the invention may be related to a treatment device for treating a lens of an operational device. The treatment device may include a housing defining an internal volume and having an opening; an actuator configured to displace the operational device relative to the housing so as to enable a surface of the lens to be sealed within the internal volume or not to be sealed within the internal volume; a first electrode located in close proximity to the lens, when the surface of the lens is sealed in the internal volume; a second electrode located at a predetermined distance from the first electrode, the predetermined distance is determined to allow an ionization of a gas between the first and the second electrode; and an RF generator electrically associated with the first electrode and the second electrode.

In some embodiments, the second electrode may be placed inside the internal volume. In some embodiments, the second electrode is placed outside of the internal volume and the housing is at least partially made of a dielectric material.

In some embodiments, the first or the second electrode may be covered with a dielectric material. In some embodiments, the housing may be fixed and the actuator is configured to rotate the operational device such that the external surface of the lens is sealed in the internal volume. In some embodiments, the housing may be a movable housing and wherein the actuator is configured to move the movable housing to seal the external surface of the lens.

In some embodiments, the treatment device may further include a pump for pumping gas from the internal volume when the surface of the lens is sealed therein. In some embodiments, the treatment device may further include a gas supply unit for supplying gas to the internal volume when the surface of the lens is sealed therein. In some embodiments, the treatment device may further include at least one of a wiper and a drier for drying the lens prior to the application of the RF energy. In some embodiments, the treatment device may further include a controller configured to: control the actuator to cause the external surface of the lens to be sealed by the internal volume; and activate the RF generator to provide RF energy to the first and second electrodes when the lens is sealed in the internal volume.

Some additional aspects of the invention may be related to a method of treating a lens included in an operational device. In some embodiments, the method may include sealing a surface of the lens in an internal volume in a housing included in a device for treating a lens; and generating plasma in the internal volume, thereby rendering the surface of the lens hydrophilic. In some embodiments, generating the plasma may be by providing RF energy to: a first electrode located in close proximity to the lens, when the surface of the lens is sealed in the internal volume; and a second electrode located at a predetermined distance from the first electrode, the predetermined distance is determined to allow an ionization of a gas between the first and the second electrode.

In some embodiments, the method may further include creating a sub-atmospheric pressure inside the internal volume when the surface of the lens is sealed in the internal volume. In some embodiments, the method may further include providing gas to the interval volume when the surface of the lens is sealed in the internal volume. In some embodiments, the method may further include forming plasma in a dielectric-barrier discharge (DBD) mode over the external surface of the lens.

Some additional aspects of the invention may be related to a method of treating a lens included in an operational device. In some embodiments, the method may include positioning at least two electrodes may be in vicinity to a lens of an operational device; and generating plasma adjacently to a surface of the lens by supplying EM RF power to the electrodes from a RF generator associated thereto, thereby rendering the surface of the lens hydrophilic.

In some embodiments, the method may further include simultaneously moving the at least at least two electrodes over the first surface while generating the plasma. In some embodiments, the method may further include providing gas to form the plasma adjacently to the surface of the lens. In some embodiments, the method may further include forming the plasma in a dielectric-barrier discharge (DBD) mode over the first surface of the lens.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Some aspects of the invention may be device or related to devices for treating lens, such as camera lenses, traffic lights lenses and the like during operation (e.g., before, after or while a device that includes the lens is operational). As used herein, the term "lens" may refer to any element that is transparent or reflective and may be exposed at least partly to the ambient atmosphere which light passes through or being reflected from. In some embodiments the "lens" may denote a transparent window or cover, whether curved or flat, whether optically effective or substantially optically neutral. A lens according to some embodiments of the invention may include a camera lens, a traffic light lens, a projector lens and the like.

Accordingly, an operational device, as used herein, may include any device that may include at least one lens, for example, a traffic light, a camera, a projector and the like. Such a device may be considered operational after leaving the assembly/manufacturing facility and placed/assembled ready to be operated or already operated. For example, a surveillance camera may be considered operational after being assembled in its final position ready for conducting surveillance. In another example, a car camera may be considered operational after the car left the assembly line. In yet another example, a traffic light may be considered operational when placed in a junction or a road.

In some embodiments, a lens covered with fog, vapor, rain or snow may have a reduced performance. For example, in cameras the blur of the captured image may occur due to condensation of water vapor, generating water droplets on the surface of the camera lens. Each droplet may act as an additional lens distorting light rays coming towards the camera lens, thus reducing dramatically the quality of the images that may be captured by the camera. The same effect may reduce the illumination efficiency of traffic lights and projector. According to some embodiments of the invention reducing such effects may be archived by manipulating a surface of the lens that might be exposed to moisture or to water, to increase the hydrophilicity thereof so as to achieve increased wetting or even complete wetting of that surface of the lens by water.

Complete wetting is achieved by increasing the surface tension of the surface of the lens to above the surface tension of water, namely above 0.072 N/m, for example, above 0.08 N/m, above 0.1 N/m or more. In some embodiments, a surface tension below 0.072 N/m may also be obtained using methods and devices according to embodiments of the invention. As can be understood by one skilled in the art embodiments of the invention are not limited to a particular surface tension.

When the surface tension of the surface of the lens is greater than the surface tension of water, water does not accumulate in droplets on the surface but rather wet the surface, having a contact angle of substantially 0 degrees. Accordingly, a treatment device according to some embodiments of the invention may apply a plasma treatment to the surface of the lens that may alter the surface tension, at least for a limited period of time, to be about or even be greater than 0.072 N/m. The treatment device may include at least two electrodes for ionizing gas between the two electrodes. According to some embodiments of the invention, the gas may be the air surrounding the lens or a gas (e.g., argon, helium) supplied to the treatment device from an external source.

The effects of plasma treatment on hydrophilicity of a treated surface are often temporary, so that hydrophilicity of a treated surface tends to decrease over time after the exposure to plasma ends. Therefore, a plasma treatment applied to a surface of a lens according to some embodiments of the invention may have to be repeated periodically during the lifetime of the operational device. For example, a lens in a car camera may be treated every time the car is started, when the car stops (e.g., at a traffic light), etc. In yet another example, a lens of a surveillance camera may be treated periodically, for example, every 2 hours.

In some embodiments, the treatment device may generate plasma in a Dielectric Barrier Discharge (DBD) mode, to ensure uniformity of the plasma generated electric field in the vicinity of the lens, and hence to ensure the quality of the plasma treatment. The quality of the plasma treatment may be determined according to the level of hydrophilicity attained and the duration of time at which the electric field is activated to obtain that hydrophilicity. In order to form a plasma in a DBD mode, an electrical isolator (e.g., made from a dielectric material) may be placed between the two electrodes. In some embodiments, the dielectric material may be the lens. Additionally or alternatively, at least one of the electrodes may be coated with an electrically isolating dielectric material.

Figure 1A:
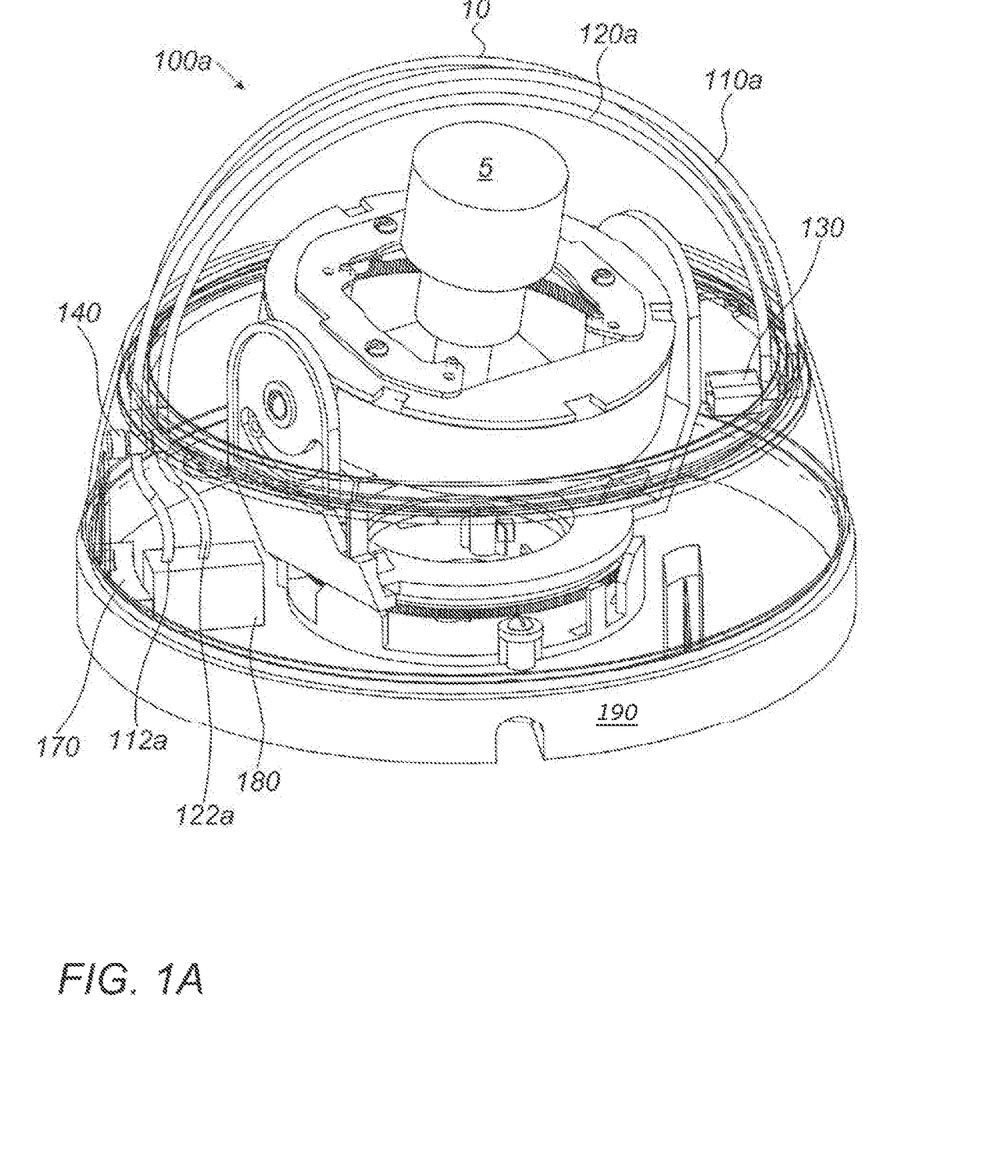
FIGS. 1A-1E are illustrations of devices for treatment lenses according to some embodiments of the invention.
Figure 1B:
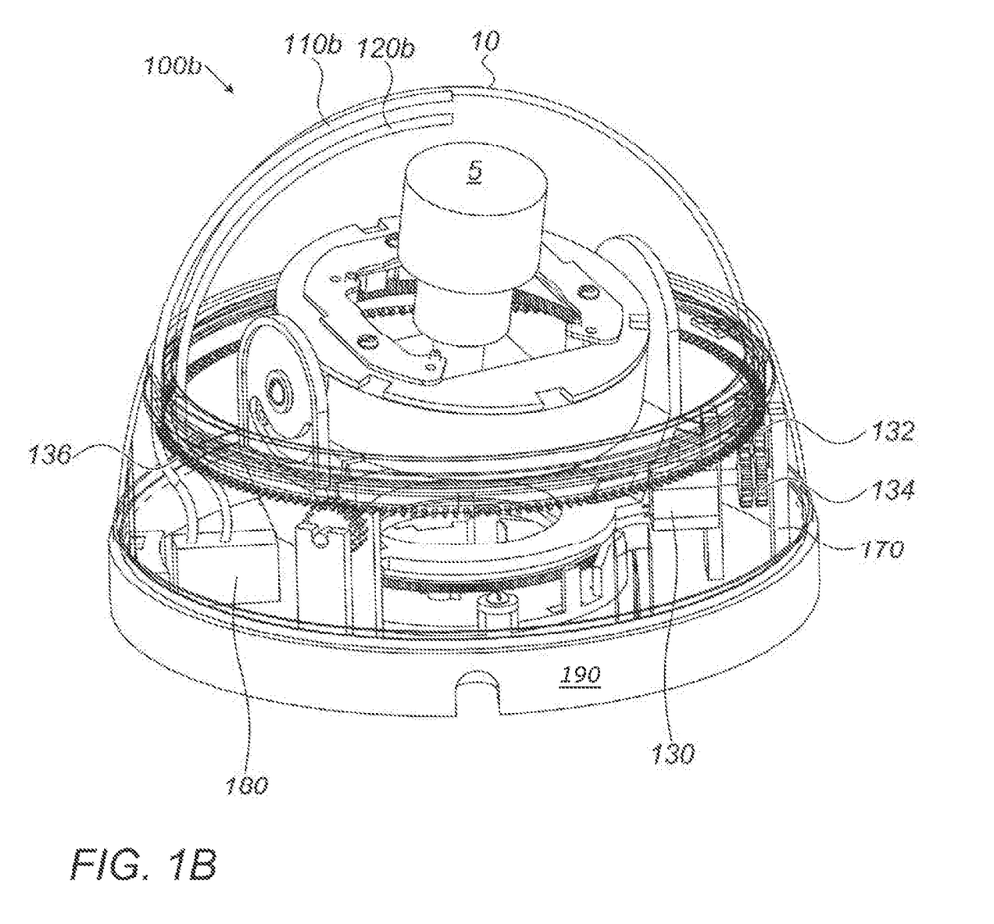
Figure 1C:
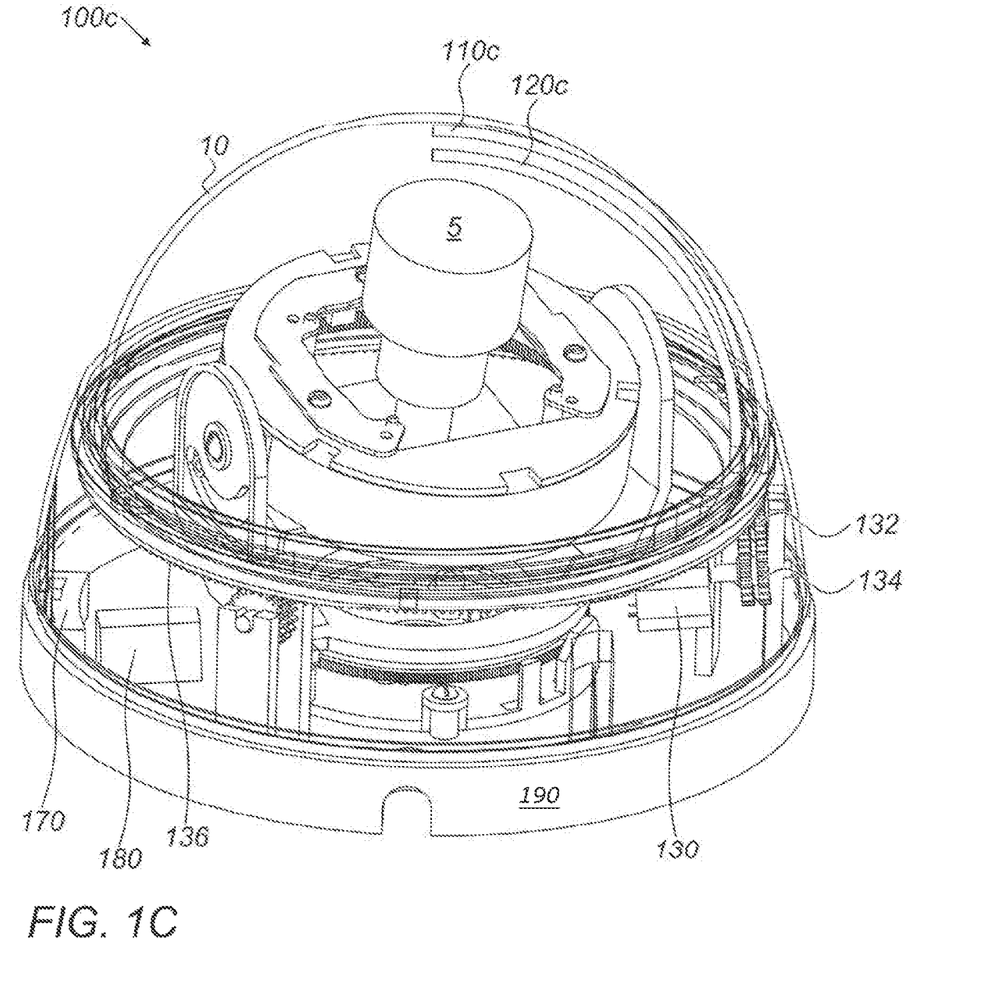

Reference is made to FIGS. 1A-1C that are illustrations of treatment devices for treating a lens included in an operational device 5 according to some embodiments of the invention. Treatment devices 100a-100e illustrated in FIGS. 1A-1E may be configured to form plasma in an open or closed environment, for example, by ionizing the air in proximity to the lens. In some embodiments, other types of gasses such as argon or helium may be supplied to treatment devices 100a-100e from external sources (not illustrated). In some embodiments, devices 100a-100e may be configured to apply sufficient electromagnetic (EM) power, in order to generate plasma. For example: "plasma may be generated in the devices 100a-100e at voltages in the range of 5-15 kV, however voltages outside that range may also be implemented in rare situations. The distance between the electrodes may typically be in the range of 10 mm-0.1 mm, however distances outside that range may be unavoidable in rare situations. The lens may be positioned between the electrodes, not necessarily in the middle. Typically, the higher the dielectric constant of the lens material and the larger the distance between the electrodes is, the higher the required voltage should be to ignite and maintain the plasma. The required voltage for generating plasma may also depend significantly on the type of gas that is ionized to generate the plasma, and on the gas' pressure. For the sake of clarification a non-limiting example may be presented: helium gas at atmospheric pressure will ignite at an RF field (e.g. in a frequency between 1 MHz and 15 MHz) of about 7 kV over a distance of 1 cm between electrodes (without a dielectric barrier in between), and at a voltage of about 200V at 0.8 kPa. With a similar configuration of electrodes and at similar field frequencies, air will ignite at a voltage of about 20 kV in atmospheric pressure and at a voltage of about 800V in 0.8 kPa.

It is further noted that the terms energy and power, and expressions incorporating these terms, are used interchangeably herein in the context of ionizing gas using electromagnetic fields. In other words, expressions such as RF energy being applied to electrodes, or EM power being supplied by a power source, and similar expressions, are all directed to electromagnetic power (current and voltage), typically at radio-frequencies, being supplied to the electrodes from a power source, thereby effecting a plasma-generating field in the vicinity of the electrodes. The electrical association of the power source with the electrodes may typically be galvanic (involving electrical contact), however in some cases such association may include capacitive coupling or EM induction (thus avoiding galvanic contact).

FIG. 1A illustrates a treatment device 100a that is configured to apply plasma treatment to a semi spherical lens 10, according to some embodiments of the invention. Semispherical lens 10 may be included in an operational device 5 (such as a camera, for example, a car camera or a surveillance camera). Treatment device 100a may include at least one first electrode 110a located in proximity to a first surface of lens 10 and at least one second electrode 120a. In some embodiments, the first surface may be the surface to be treated by treatment device 100a. In some embodiments, the first surface may be the external surface, when reduction of blur due to fog and rain is required. In some embodiments, the first surface may be the internal surface of lens 10 when reduction of vapor condensation accumulation on the internal surface of the dome of lens 10 is required. In some embodiments, both surfaces of lens 10 are treated during the plasma to increase their hydrophilicity. In some embodiments, lens 10 may be located between at least one first electrode 110a and at least one second electrode 120a. In some embodiments, both at least one first electrode 110a and at least one second electrode 120a may be located in proximity to the first surface of the lens.

Treatment device 100a may further comprise an RF generator 180 for providing RF energy to at least one first and at least one second electrodes 110a and 120s in an amount sufficient to generate plasma on the first source of lens 10. RF generator 180 may be electrically associated with electrodes 110a and 120a. It is noted that RF generator 180 may in some embodiments be located within a same housing together with operational device 5, as is depicted in FIG. 1A. In some embodiments, RF generator 180 may be positioned outside such a housing, and may further be located relatively distantly from the operational device and from the electrodes 110a and 120a.

In some embodiments, treatment device 100a may further include at least one attachment element 170 configured to attach treatment device 110a to operational device 5. Such attachment element 170 may include one or several parts, allowing, for example, to attach treating device 100a to operation device 5 as an add-on. Such attachment may be carried out accordingly onto operational device 5 when it is already operational, in the field, and not during manufacturing.

In some embodiments, at least one second electrode 120a may be located in proximal to the first surface of lens 10 (e.g., the external surface illustrated). In some embodiments, at least one second electrode 120a may be located in proximity to first electrode 110a from the first surface of lens 10. Electrodes 110a and 120a may be shaped as curved strips made from any suitable conducting material, for example, metals or alloys. Electrodes 110a and 120a may be located in a close proximity, but not touching lens 10, for example, electrode 110a may be located at a distance of 1 mm or less, or between 1 mm and 2 mm or 2 mm or more from the first (e.g., external) surface of lens 10 and electrode 120a may be located at a distance of 1 mm, 2 mm or more from a second (e.g., internal) surface of lens 10.

In some embodiments, an electrical isolator made from a dielectric material is located between the at least one first electrode 110a and the at least one second electrode 120a. In some embodiments, the electrical isolator may be lens 10. In some embodiments, the electrical isolator (e.g., dielectric material) may be a coating or a shield for covering at least a portion of at least one first electrode 110a and at least one second electrode 120a. Examples for dielectric materials may be metallic oxides (e.g., alumina), polycarbonates, Teflon and the like. In some embodiments, the electrical isolator may allow generating plasma on the surface to-be-treated of lens 10 in a DBD mode.

Electrodes 110a and 120a may be connected to a shaft 140 so as to simultaneously move (e.g., rotate) electrodes 110a and 120a over the first surface of lens 10. Shaft 140 may be rotated using an actuator 130 (e.g., an electric motor). The movement may simultaneously rotate electrodes 110a and 120a from one edge of the half-dome lens 10 to the other edge of the lens 10, back and forth, each time a plasma treatment should be applied to lens 10. In some embodiments, RF energy may be applied to electrodes 110a and 120a in order to form plasma, for example, in DBD mode over the first surface of lens 10. Device 100a may further include RF generator 180 configured to provide RF energy to at least one first and at least one second electrodes 110a and 120a in an amount sufficient to generate plasma on the external surface of lens 10. RF generator 180 may apply a required voltage between electrodes 110a and 120a at a required frequency to ionized gas on the external surface of lens 10. For example, an RF energy may be applied at a frequency between 10 KHz and 1 GHz and a voltage of 5-15 kV (however voltages outside this range may be used in some cases).

In some embodiments, the RF energy may be provided to electrodes 110a and 120a via feeding lines 112a and 122a. In some embodiment, the voltages may be provided to at least one first electrode 110a using a designated feeding line 112a and RF energy may be provided to at least one second electrode 120a, using a designated feeding line 122a as to form the required EM field between electrodes 110a and 120a. In some embodiments the RF generator may be electrically associated with the electrodes via capacitive coupling or EM induction or a combination thereof.

In some embodiments, treatment device 100a may further include a controller, not illustrated. The controller may be configured to control RF generator 170 to provide RF energy to at least one first and to at least one second electrodes 110a and 120a. In some embodiments, the controller may further control actuator 130 to synchronize the movement of the at least one first and the at least one second electrodes 110a and 120a with the RF energy application. The RF energy may be applied while actuator 130 is moving electrodes 110a and 120a over the surface of lens 10 to treat the entire first surface of lens 10.

One or more attachment elements 170 may be configured to attach treatment device 100a to operational device 5 (e.g., a camera, a traffic light, a projector and the like). One or more attachment elements 170 may include any attachment means, such as, clips, screws, bolts, strips etc. In some embodiments, treatment device 110a may include a farm or housing 190 for holding electrodes 110a and 120a, actuator 130, controller 180 and any other component included in device 100a. In some embodiments, attachment elements 170 may be configured to attach farm or housing 190 to operational device 5 such that first electrode 110a may be located in closed proximity to the surface of lens 10.

In some embodiments, treatment device 100a may be permanently attached to operational device 5 (as illustrated), for example, when second electrode 120a is located in proximity to the internal surface of lens 10. Such an assembly may be conducted in an assembly line during the manufacturing process of operational device 5. In some embodiments, treatment device 100a may be removably attached from operational device 5 and attachment elements 170 may be configured to attach and detach treatment device 100a from the operational device. For example, a removable treatment device 100a may be attached to an already standing traffic light, during a retrofit project.

FIG. 1B illustrates a treatment device 100b that is configured to apply plasma treatment to semi spherical lens 10, according to some embodiments of the invention. Treatment device 100b may include at least one first electrode 110b located in proximity to a first surface of lens 10 and at least one second electrode 120b. In some embodiments, the first surface may be the surface to be treated by treatment device 100b, as discussed with respect to device 100a.

Treatment device 100b may further include RF generator 180 for providing RF energy to at least one first and at least one second electrodes 110b and 120b in an amount sufficient to generate plasma on the first surface of lens 10. In some embodiments, device 100b may further include at least one attachment element 170 configured to attached treatment device 100b to operational device 5 and a controller (not illustrated). RF generator 180, attachment element 170 and the controller were broadly discussed above with respect to treatment device 100a and the discussion is applicable to treatment device 100b as well.

In some embodiments, the first surface may be the external surface (as illustrated) and at least one second electrode 120b may be located in proximity to the internal. In some embodiments, the first surface may be the internal surface. In some embodiments, at least one second electrode 120b may be located in proximity to first electrode 110b from the first surface of lens 10. Electrodes 110b and 120b may be shaped as curved strips (e.g., shaped as circular arcs, e.g. ¼ of a circle) made from any suitable conducting material, for example, metals or alloys. Electrodes 110b and 120b may be located in a close proximity, but not touching lens 10, for example, electrode 110b may be located at a distance of less than 1 mm, or between 1 and 2 mm or 2 mm or more from the external surface of lens 10. Likewise, electrode 120b may be located at a distance of less than 1 mm, or between 1 and 2 mm or 2 mm or more from the internal surface of lens 10.

In some embodiments, an electrical isolator made from a dielectric material may be located between at least one first electrode 110b and at least one second electrode 120b. In some embodiments, the electrical isolator may be lens 10. In some embodiments, the electrical isolator (e.g., dielectric material) may be a coating or a shield for covering at least a portion of at least one first electrode 110b and at least one second electrode 120b. Examples for dielectric materials were given herein above. In some embodiments, the electrical isolator may allow to generate plasma on the external surface of lens 10 at a DBD mode.

Electrodes 110b and 120b may be connected to a circular conveyor 136 (e.g., a crown gear) that may be configured to simultaneously rotate electrodes 110b and 120b around the central axis. A circular movement may be transferred to conveyor 136 from an actuator 130 (e.g., an electric motor) via cogwheels 132 and 134. Conveyor 136 may include for example a crown gear or any other suitable device.

In some embodiments, the RF energy may be provided to electrodes 110b and 120b via feeding lines 112b and 122b, as discussed above with respect to device 100a. In some embodiments the RF generator may be electrically associated with the electrodes via capacitive coupling or EM induction or a combination thereof.

In some embodiments, treatment device 100b may be configured to form plasma in DBD mode over the surface of lens 10 between electrodes 110b and 120b. In some embodiments, if an RF energy at the required voltage and frequency is applied between electrodes 110b and 120b while the electrodes rotate around axis 30, the entire surface of lens 10 may undergo a plasma treatment.

Referring now to FIG. 1C which illustrates a treatment device 100c that is configured to apply plasma treatment to a semi spherical lens 10, according to some embodiments of the invention. Treatment device 100c may include substantially the same components as treatment device 100b. However, the RF energy may be provided to electrodes 110c and 120c from RF generator 180 directly from conveyor 136. For example, an electrical separation (e.g., by an electrical isolator) may be conducted between a first crown gear rotating electrode 110c and a second crown gear rotating electrode 120c. In some embodiments, the first and second crown gears may be included in conveyor 136.

Figure 1D:
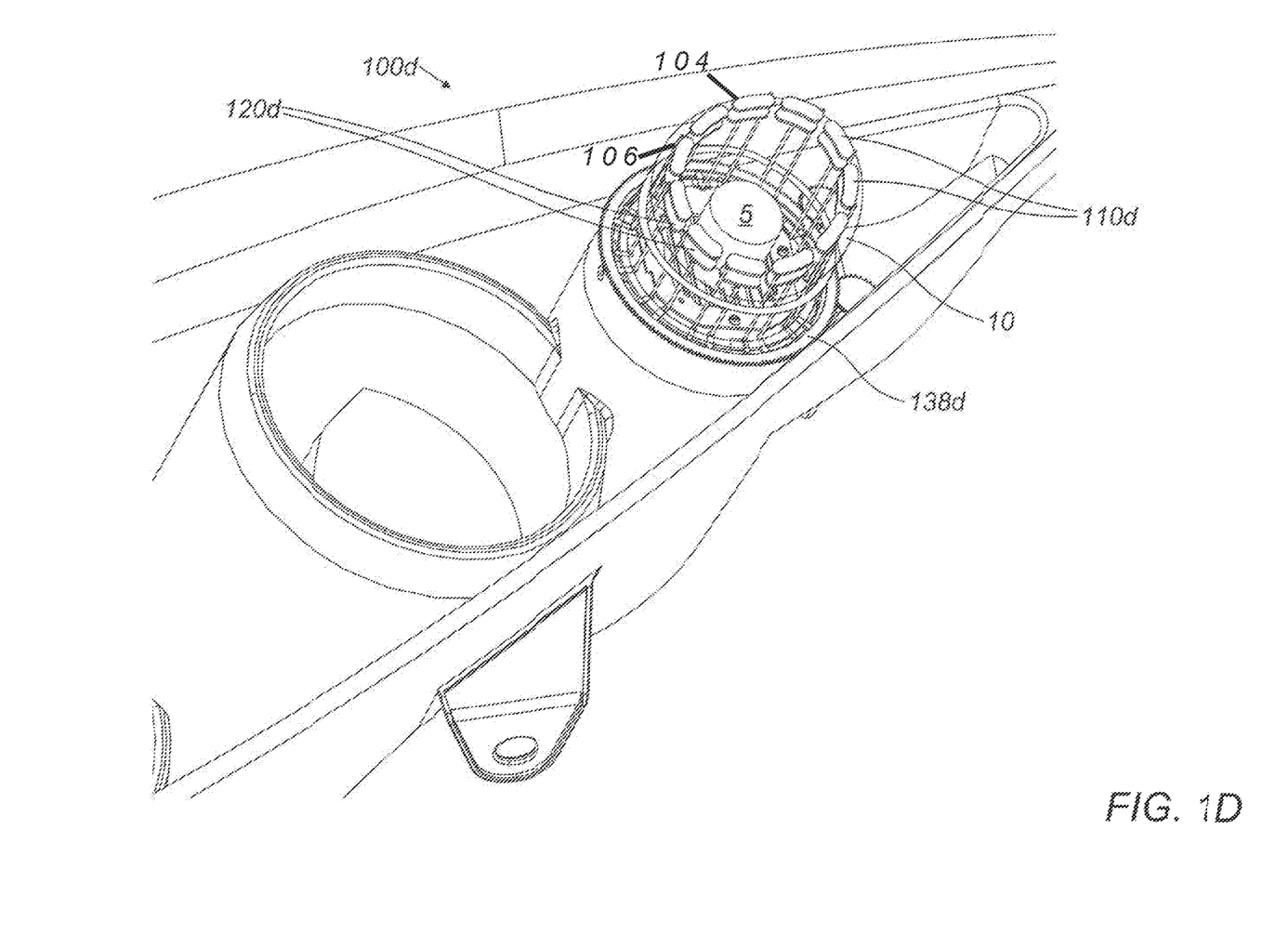

Referring now to FIG. 1D which illustrates a treatment device 100d that is configured to apply plasma treatment to a semi spherical lens 10, according to some embodiments of the invention. Treatment device 5 may be attached/assembled to an operational device 100d, such as the car camera illustrated being assembled into the headlight and/or the taillight of a car. In some embodiments, two or more first electrodes 110d and two or more second electrodes 120d may be included in device 100d, for example, the plurality of electrode segments illustrated. It should be noted that any number of first electrode 110a-110d and second electrodes 120a-120d can be included in any embodiment of any treatment device according to the invention.

In some embodiments using such a multitude of pairs of electrodes may facilitate employing a more uniform areal intensity of energy over the treated surface. In the treatment device of 1B for example, electrodes 110b and 120b may each be replaced by a multitude of electrically separated electrode segments, arranged along the same locations of electrodes 110b and 120b. Each of the multitude of electrodes may be supplied with a RF power at a different intensity or/and at a different duty cycle. For example, an electrode segment closer to the edge of the lens (closer to the conveyor) may be supplied with a more intense power or with EM power at a higher duty cycle, compared to an electrode segment closer to the tip (or center) of the lens. This is because the area covered by an electrode closer outer edge is significantly larger than the area covered by an electrode segment closer to the center.

In some embodiments, a plurality of pairs of first and second electrodes 110d and 120d may be arranged in a circular configuration from two sides (namely adjacent the two surfaces) of lens 10. In some embodiments, first electrodes 110d may be located in proximity to a first surface of lens 10 (e.g., the external or internal surface). In some embodiments, second electrodes 120d may be located in proximity to a second surface of lens 10. In some embodiments, second electrodes 120d may be located in proximity to first electrodes 110d from the first side of the lens.

In some embodiments, device 100d may further include a conveyor 138d for conveying a rotational movement to first and second electrodes 110d and 120d. In some embodiments, the RF energy may be provided to electrodes 110d and 120d from an RF generator (not illustrated) directly from conveyor 138d. For example, an electrical separation (e.g., by an electrical isolator) may be conducted between a first crown gear rotating electrodes 110d and a second crown gear rotating electrodes 120d. In some embodiments, the first and second crown gears may be included in conveyor 138d.

In some embodiments, device 100d may further include a distributor (not shown here) for distributing RF energy from the RF generator to each of the first electrodes 110d separately (each such single electrode 110d being termed here a segment of the first electrode). In such embodiments the distributor may receive in an input port RF energy from the RF generator, and distribute the RF energy to one of multiple output ports, each output port being electrically associated with a segment of the first electrode. In such embodiments the second electrode may be a single electrode, that is to say a non-segmented electrode, being constantly associated with the RF generator. Additionally or alternatively, the second electrode—120d may include a multitude of segments electrically separated from one another as depicted in FIG. 1D, wherein each segment is electrically associated with the RF generator via a distributor. In such embodiments, each of the electrodes 110d and 120d may be electrically associated to the RF generator via a separate distributor. Therefore, RF power may be provided e.g. sequentially to pairs of electrodes, each pair including a single segment of the first electrode and a single segment of the second electrode. Upon receiving RF power, each pair of segments may generate plasma thereby effecting a plasma treatment to a portion of the lens surface. By sequentially distributing the RF power to all pairs, the entire lens surface may be treated, a portion after portion, sequentially. As described above, in some embodiments, upon allocating RF to the various pairs of segments, duty cycle or intensity or another RF power parameter may be varied or tuned. In some embodiments the distributor may be electrical; in some embodiments the distributor may be electromechanical, as is known in the art. In some embodiments distributing RF power to the various electrode segments may be controlled by a controller (not shown here); in some embodiments distributing RF power to the various electrode segments may be synchronized with another sequential process, such as the operation of the operational device 5.

Figure 1E:
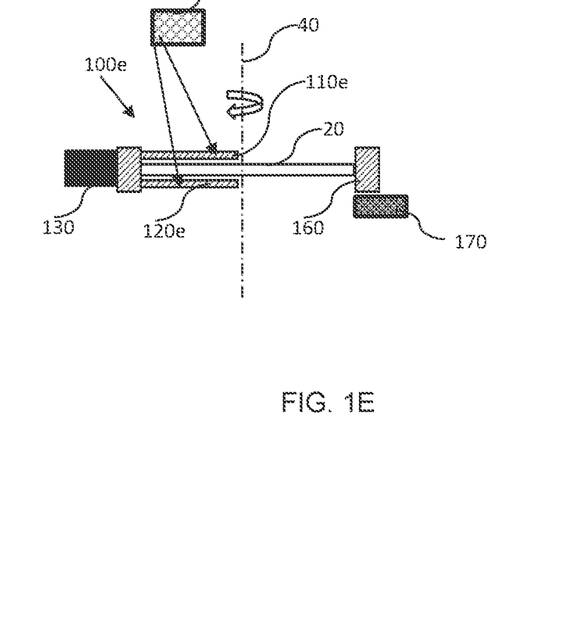

Referring now to FIG. 1E which illustrates a side view (a cross section) of a treatment device 100e that is configured to apply plasma treatment to a flat lens 20, according to some embodiments of the invention. Treatment device 100e may include at least one first electrode 110e located in proximity to a first surface of lens 20 and at least one second electrode 120e. In some embodiments, two or more first electrodes 110e and two or more second electrodes 120e may be included in device 100e, for example, from two sides of lens 20.

Treatment device 100e may further include, a controller, at least one attachment element 170 configured to attached treatment device 110e to an operational device (not illustrated) and an RF generator 180 for providing RF energy to at least one first electrode 110e and at least one second electrode 120e in an amount sufficient to generate plasma on the external surface of lens 20. The controller, RF generator 180 and attachment element 170 were broadly discussed above with respect to treatment device 110a and the discussion is applicable to treatment device 100e as well.

In some embodiments, at least one second electrode 120e may be located in proximity to a second side of lens 20. Lens 10 may be included in an operational device (not illustrated). Electrodes 110e and 120e may be shaped as straight strips, (e.g., a length of the radius of lens 20, when lens 20 is a circular lens) made from any suitable conducting material, for example, metals or alloys. Electrodes 110e and 120e may be located in a close proximity, but not touching lens 20, for example, electrode 110e may be located at a distance of less than 1 mm, or between 1 and 2 mm or 2 mm or more from the first surface of lens 20 and electrode 120e may be located at a distance of less than 1 mm, or between 1 and 2 mm or 2 mm or more from the second surface of lens 20.

Electrodes 110e and 120e may be connected to a circular conveyor 160 operated by an actuator 130 (e.g., an electric motor). Circular conveyor 160 may be configured to simultaneously rotate electrodes 110c and 120c around axis 40, as illustrated. Accordingly, when circulated around lens 20, electrodes 110e and 120e may cover the entire surface of lens 20.

Figure 2:
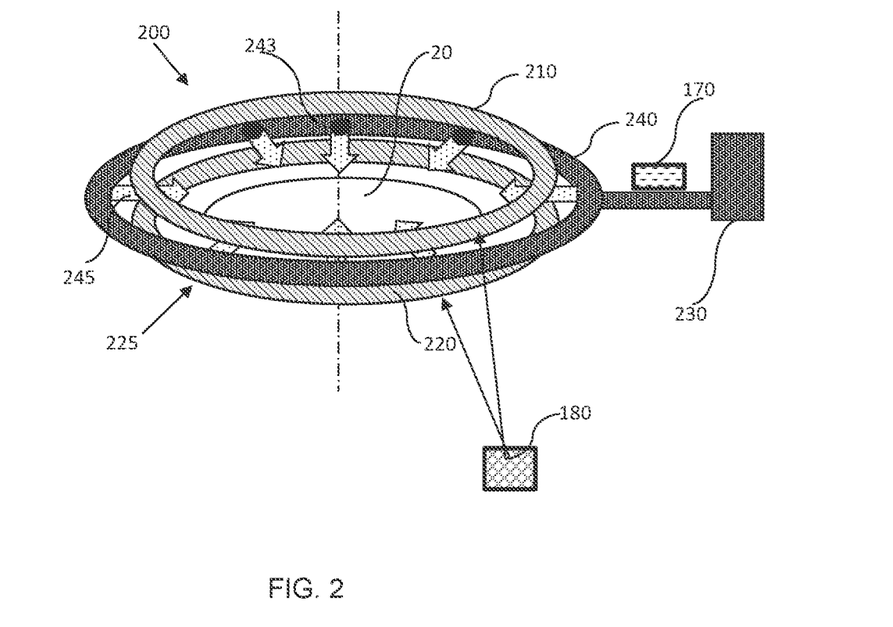
FIG. 2 is an illustration of a device for treatment lenses according to some embodiments of the invention.

In some embodiments, treatment devices 100a-100e may further include a gas supply unit for supplying gas to a gap between the outer surface of the lens and the first electrode, for example, the gas supply unit illustrated and discussed with respect to FIG. 2 hereinbelow. As should be understood to one skilled in the art, the gas supply unit of FIG. 2 is given as an example only and embodiments of the invention are not limited to the disclosed gas supply unit. Treatment devices according to any embodiment of the invention may include any gas supply unit known in the art.

Reference is now made to FIG. 2 which is an illustration of a treatment device 200 for treating a lens included in an operational device (e.g., device 5 illustrated in FIGS. 1A-1D) according to some embodiments of the invention. Treatment device 200 may include a first electrode 210 and a second electrode 220 made from any suitable conducting material. In some embodiments, at least one of electrodes 210 and 220 may be coated with dielectric material in order to enhance the formation of plasma at a DBD mode, on the surface of flat lens 20. In some embodiments electrode 220 may be located in proximity to lens 20, optionally surrounding lens 20 (as illustrated). In some embodiments, electrode 210 may be located at a predetermined distance from electrode 220, for example, 0.1-1 mm or 1-2 mm, or 2-3 mm or 3-10 mm or more than 10 mm. In some embodiments, both electrodes 210 and 220 may be located in proximity to a first surface of lens 20, such that the first surface may be treated by a plasma generated by electrodes 210 and 220.

In some embodiments, treatment device 200 may further include a gas supply unit 225. Gas supply unit 225 may include: a circular conduit (e.g., a pipe) 240 configured to deliver gas streams 245 (e.g., helium streams) via openings 243 in conduit 240. Circular conduit 240 may surround electrodes 210 and 220, and may be located such that gas streams 245 are directed to flow between electrodes 210 and 220. Circular conduit 240 may be connected to a reservoir/pump 230 for supplying pressurized gas (e.g. helium) for forming gas streams 245.

In some embodiments, device 200 may further include an RF generator 180 and a controller (not illustrated) for applying RF energy to electrodes 210 and 220 for forming plasma between electrodes 210 and 220, and for controlling both the RF energy application and the gas flow. Gas steams 245 that flow between electrodes 210 and 220 when the required amount of voltage at the required frequency is applied to the electrodes, may be ionized to form streams of plasma that may treat the surface of lens 20.

Treatment device 200 may further include at least one attachment element 170 configured to attached treatment device 200 to the operational device. The controller, RF generator 180 and attachment element 170 were broadly discussed above with respect to treatment device 110a and the discussion is applicable to treatment device 200 as well.

As may be understood by a person skilled in the art, the embodiment disclosed in FIG. 2 is given as an example only, and the different components of device 200 may have different geometrical shapes and arrangements. Accordingly, the invention is not limited to the particular shapes illustrated in FIG. 2.

Figure 3A:
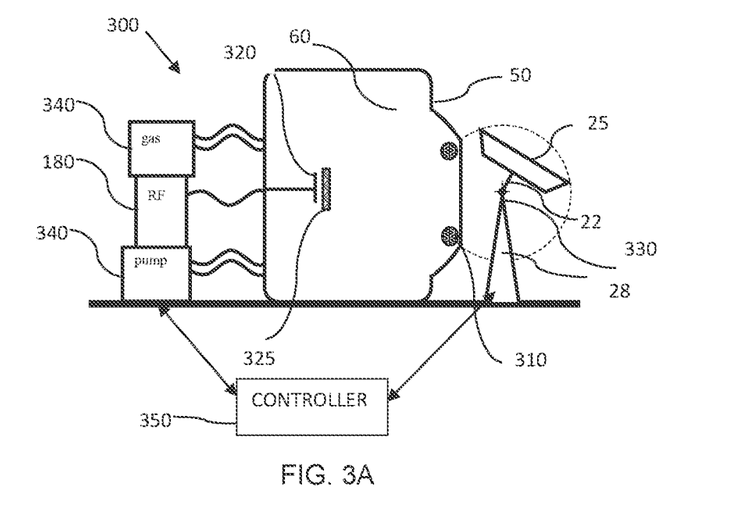
FIGS. 3A-3C are an illustrations of a device for treatment lenses according to some embodiments of the invention.
Figure 3B:
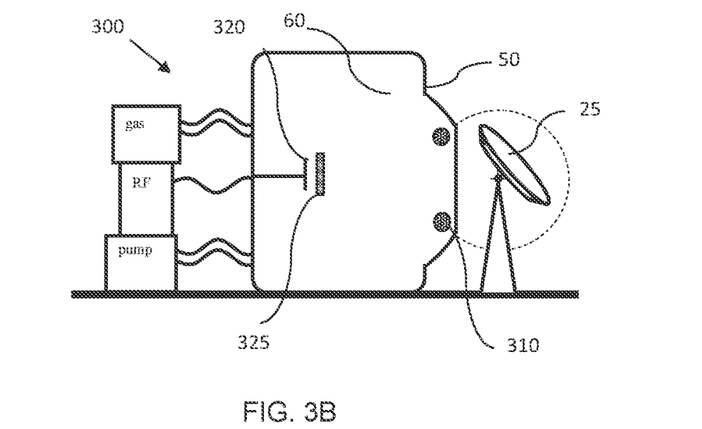
Figure 3C:
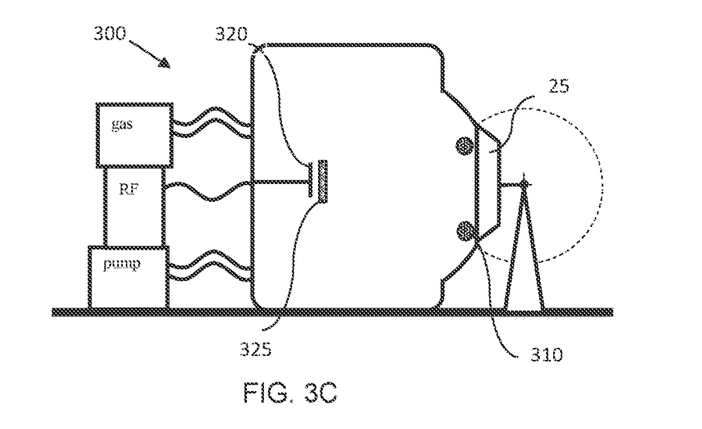

Reference is now made to FIGS. 3A-3C which are illustrations of a treatment device 300 for treating lenses, at three different operational stages, according to some embodiments of the invention. Treatment device 300 may be installed to treat a lens 25 of operational device 28 (e.g., camera). Treatment device 300 may include a housing 50 a housing defining an internal volume 60 and having an opening, a first electrode 310 and a second electrode 320. Treatment device 300 may further include an RF generator 180, and a controller 350. RF generator 180 may be electrically associated with first electrode 310 and second electrode 320. In some embodiments, first electrode 310 may be located in close proximity to lens 25 when the surface of the lens is sealed in the internal volume. In some embodiments, device 300 or operational device 28 may further include an actuator 330. Actuator 330 may be configured to displace operational device 5 relative to housing 50 so as to enable a surface of lens 25 to be sealed within internal volume 60 or not to be sealed within internal volume 60.

In some embodiments, second electrode 320 may be located at a predetermined distance from first electrode 310. In some embodiments, the predetermined distance may be determined to allow an ionization of a gas between first and second electrodes 310 and 320. In some embodiments, second electrode 320 may be placed inside internal volume 60, as illustrated. In some embodiments, second electrode 320 may be placed outside of internal volume 60 and housing 50 may be at least partially made of a dielectric material. Such configuration may cause plasma generation on the surface of lens 25 at a DBD mode.

As illustrated in FIGS. 3A-3C operational device 28 may be configured to rotate around shaft 22. In some embodiments, shaft 22 may be located outside of housing 50. The displacement of operational device 28 may be set around shaft 22 and may be presented as an imaginary sphere (dashed circle). In some embodiments, lens 25 may turn towards the surrounding when operational device 28 captures images, as illustrated in FIGS. 3A and 3B and turn towards internal volume 60 when operational device 28 is turned off (as illustrated in FIG. 3C). In the later position operational device 28 may close housing 50, such that volume 60 may be sealed from gas exchange with the outside. In such case lens 25 may have the same shape as the opening of housing 50. In some embodiments, various mechanisms may be considered for sealing (e.g. a mechanism that pushes lens 25 onto the opening of housing 50, a mechanism that forms under pressure that suck lens 25 to seal the opening of housing 50 and the like). Lens 25, may be a semi-spherical lens, a curved lens or a flat lens.

Device 300 may include a first electrode 310 and second electrode 320 made from any suitable conducting material. Electrode 310 may be shaped as a ring and may be located in close proximity to lens 25, for example, around lens 25, when lens 25 is encapsulated in internal volume 60 and housing 50 (e.g., as illustrated in FIG. 3C). In some embodiments, electrode 310 may be shaped as a net stretching across the opening of housing 50. Yet in some embodiments, electrode 310 may be attached to the lens, as, e.g. a ring on the periphery of the lens. Electrode 320 may be located at a predetermined distance (e.g., 0.1-1 mm or 1-2 mm, or 2-3 mm or 3-10 mm or more than 10 mm) from electrode 310. In some embodiments, a dielectric material 325 may cover or coat electrode 320 and/or electrode 310 in order to form by electrodes 310 and 320 plasma at a DBD mode on the surface of lens 25.

In some embodiments, actuator 330 may include any devise that may allow to cause a relative movement between treatment device 300 and operational device 28, such that housing 50 may seal the external surface of lens 25 prior to the generation of the plasma by RF generator 180. In some embodiments, housing 50 may be fixed and actuator 330 may be configured to rotate operational device 28 such that the external surface of lens 25 may be sealed by internal volume 60 as illustrated.

In some embodiments, housing 50 may be a movable housing and actuator 330 may be configured to move movable housing 50 to encapsulate and seal the external surface of lens 25. For example, actuator 330 may roll up housing 50 when operational device 28 is operating to reveal lens 25 and may roll down housing 50 when operational device 28 is not operating.

In some embodiments, housing 50 may be configured to completely cover and encapsulate operational devise 28 when a plasma treatment to lens 25 is required, for example, housing 50 may be shaped as semispherical cover. In such case housing 50 may be configured to be folded or removed when camera 28 is operating and open to cover camera 28 during the plasma treatment, to form closed volume 60.

In some embodiments, treatment device 300 may further include a pump 340 for forming under-pressure inside volume 60, for example, the pressure inside volume 60 may be 1-200 mbars. In some embodiments, electrode 320 may be located outside of housing 50, as housing 50 may be the dielectric material. In some embodiments, treatment device 300 may further include a gas supply unit 340 for supplying gas to internal volume 60 prior to or during the application of the RF energy.

In some embodiments, treatment device 300 may further include RF generator 180 for providing RF energy to electrodes 310 and 320 for forming plasma between electrodes 310 and 320. In some embodiments, controller 350 may be configured to control actuator 330 to cause the external surface of lens 25 to be sealed by internal volume 60 and to activate RF generator 180 to provide RF energy to the first second electrodes 310 and 320 when lens 25 is sealed in internal volume 60. Controller 330 may further be configured to control pump 340 and/or gas supply unit 340. When applying the required amount of EM power at the required frequency to electrodes 310 and 320 at a pressure of 1-200 mbars, ionized gas (plasma) may be formed on the surface of lens 25.

In some embodiments, gas supply unit 340 may be configured to supply a controlled environment (e.g., argon, helium, etc.) to volume 60 at a controlled pressure.

In some embodiments, any one of devices 100a-100e, 200 or 300 may further include at least one of a wiper and a drier for drying lenses 10, 20 or 25 prior to applying the plasma treatment. In some embodiments, when one of lenses 10, 20 or 25 is wet due to wet weather, the lens may be wiped and/or dried using the wiper and/the drier prior to the application of the RF energy to electrodes 110a-110e, 120a-120e, 210, 220, 310 and 320.

Figure 4A:
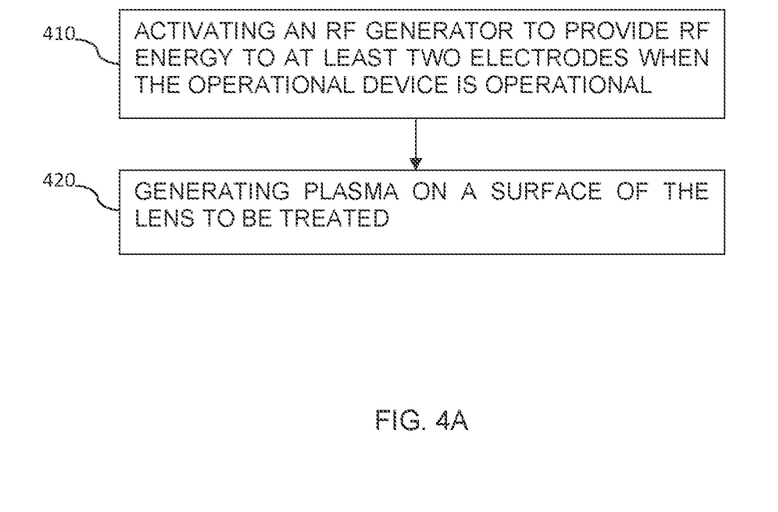
FIG. 4A is a flowchart of a method of treating a lens according to some embodiments of the invention.

Reference is now made to FIG. 4A which is a flowchart of a method of treating a lens included in an operational device according to some embodiments of the invention. The method of FIG. 4A may be performed by any one of treatment devise 100a-100e, 200 and 300 or any treatment device according to embodiments of the invention. In box 410, RF generator (e.g., RF generator 180) may be activated to provide RF energy to at least two electrodes when the operational device (e.g., operational device 5) is operational. For example, RF generator 180 may provide RF energy at a frequency between 10 KHz and 1 GHz and a voltage of 7-15 kV. The RF energy may be provided to at least one first electrode, 110a-110e, 210 and 310 and to at least one second electrode, 120a-120e, 220 and 320.

In box 420, plasma may be generated on a first surface of the lens. For example, gas located in proximity to the at least one first electrode may be ionized to form plasma and thus may treat the surface of the lens (e.g., lens, 10, 20 and 25) to alter the surface tension, at least for a limited period of time, for example, to be about or even be greater than 0.072 N/m. In some embodiments, the plasma may be formed in a dielectric-barrier discharge (DBD) mode over the first surface of the lens. For example, when an electrical isolator (e.g., a dielectric material) may be placed between the at least one first electrode and the at least one second electrode, as disclosed above.

Some embodiments may further include simultaneously moving the at least one first electrode and the at least one second electrode over the first surface of the lens while generating the plasma. For example, an actuator such as actuator 130 may cause at least one first electrode, 110a-110e, 210 and 310 and/or at least one second electrode, 120a-120e, 220 and 320 to simultaneously move over the surface of lenses 10, 20 and 25 as to cover the entire surface of the lens.

Some embodiments may further include providing gas to be ionized onto the external surface of the lens. For example, a gas supply unit, such as, unit 225 or any other gas supply unit known in the art, may supply gas (e.g., pressurized air, nitrogen, argon, helium, etc.) to the surrounding of lenses 10, 20 and 25 to be ionized.

Figure 4B:
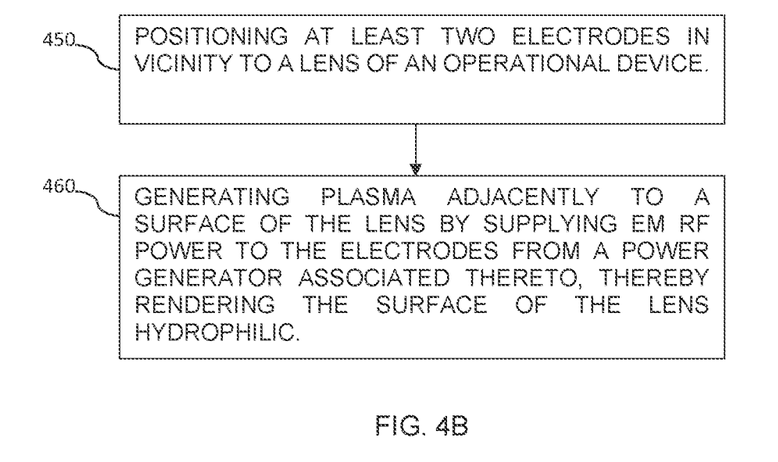
FIG. 4B is a flowchart of a method of treating a lens according to some embodiments of the invention.

Reference is now made to FIG. 4B which is a flowchart of method of treating a lens included in an operational device according to some embodiments of the invention.

The method of FIG. 4B may preformed any one of treatment device 100a-100e, 200 and 300 or by any treatment device according to embodiments of the invention. In box 450, at least two electrodes may be positioned in vicinity to a lens of an operational device. In some embodiments, first electrodes 110a-110c, 210 and 310 and second electrodes 120a-120c, 220 and 320 may be positioned in vicinity to lenses 10, 20 or 25. In box 460, plasma may be generated adjacently to a surface of the lens by supplying EM RF power to the electrodes from an RF generator associated thereto, thereby rendering the surface of the lens hydrophilic. In some embodiments, RF generator 180 may provide RF power/energy to at least one first and at least one second electrodes as to form plasma on the surface of lenses 10, 20 or 25. As a result of the plasma treatment provided to lenses 10, 20 or 25, at least one surface of the lenses or at least a portion of the surface of lenses 10, 20 or 25 may become hydrophilic, for example, may have a surface tension of: above 0.072 N/m, for example, above 0.08 N/m, above 0.1 N/m or more.

Figure 5:
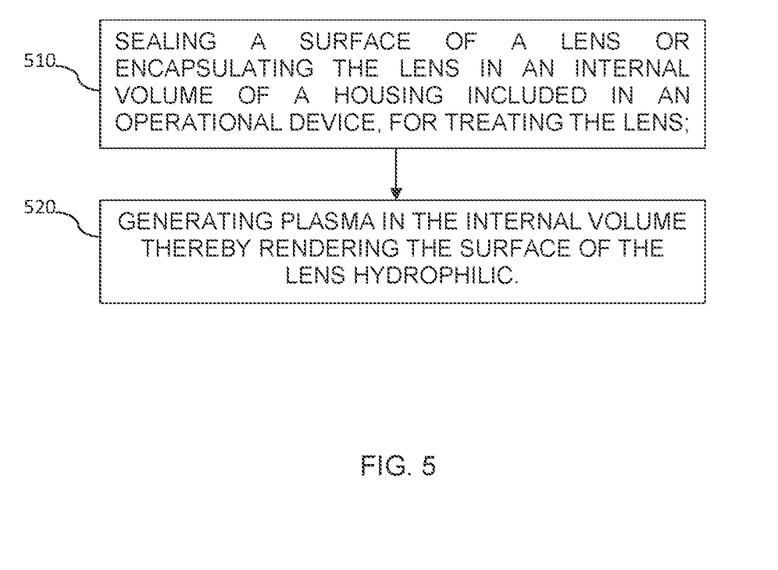
FIG. 5 is a flowchart of another method of treating a lens according to some embodiments of the invention.

Reference is now made to FIG. 5 which is a flowchart of a method of treating a lens included in an operational device according to some embodiments of the invention. The method of FIG. 5 may be performed by treatment devise 300 or by any other treatment device according to embodiments of the invention. In box 510, the lens may be sealed by (e.g., encapsulated) an internal volume in a housing included in a device for treating a lens. Actuator 330 may displace operational device 5 relative to housing 50 so as to enable a surface of lens 25 to be sealed within internal volume 60 or not to be sealed within internal volume 60. Actuator 330 may either rotate operational device 28 to be sealed by a fixed housing 50 or move a movable housing 50 to cover lens 25, as disclosed above. In some embodiments, controller 350 may control actuator 330 to cause the external surface of the lens to be sealed by internal volume 60.

In box 520, plasma may be generated in the internal volume thereby rendering the surface of the lens hydrophilic. In some embodiments, RF generator 180 may provide RF energy to first electrode 310 and second electrode 320, as disclosed above, to form a plasma. In some embodiments, the plasma may be formed in a dielectric-barrier discharge (DBD) mode over the external surface of the lens, for example, when an electrical isolator is place between first electrode 310 and second electrode 320. In some embodiments, controller 350 may activate RF generator 180 to provide RF energy to the first and second electrodes when the lens is sealed by the internal volume.

Some embodiments may further include creating a subatmospheric pressure inside the internal volume during the generation of the ionized gas, for example, using pump 340. Some embodiments may further include providing gas to form the plasma to the interval volume, for example, using gas supply unit, unit 340, or any other gas supply unit known in the art.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A treatment device for treating a lens included in an operational device, comprising:
    a first segmented electrode, comprising at least two segments electrically isolated from one another, located in proximity to a first surface of the lens, wherein the first surface is to be treated by the treatment device;
    at least one second electrode;
    a distributor electrically associated with the first segmented electrode and with the at least one second electrode, and configured to distribute RF energy from a single RF generator to each of the segments of the segmented electrode separately;
    an RF generator electrically associated with the first segmented electrode via the distributor, and with the at least one second electrode, for separately providing RF energy to the segments of the at least one first electrode and the at least one second electrode in an amount sufficient to generate plasma on at least a portion of the first surface of the lens, and
    a controller functionally associated with the distributor, wherein the treatment device is thereby configured to treat at least the first surface of the lens by sequentially providing RF energy to the segments of the first electrode, thereby treating portions of the first surface of the lens sequentially.

2. The treatment device of claim 1 wherein the distributor is electrical.

3. The treatment device of claim 1 wherein the distributor is electro-mechanical.

4. The treatment device of claim 1 wherein the at least one second electrode is segmented, the segments of the at least one second electrode being electrically isolated from one another, and the distributor is configured to distribute RF energy from the single RF generator to pairs of segments, one segment in the pair being of the first segmented electrode and the other segment in the pair being of the at least one second electrode, separately.

5. The treatment device of claim 4 wherein the segments of the first segmented electrode and the segments of the at least one second electrode are arranged, respectively, along a perimeter of the lens and proximate thereto.

6. The treatment device of claim 4 further comprising a conveyor for conveying a rotational movement to at least one of: the first segmented electrode and the at least one second electrode.

7. The treatment device of claim 6 wherein the rotational movement of the conveyor is employed electromechanically to distribute the RF energy to at least one of: the first segmented electrode and the segments of the at least one second electrode.

8. The treatment device of claim 1 wherein the controller is further functionally associated with the RF generator to control an intensity of the provided RF energy, and the treatment device is thereby configured to separately provide RF energy to the segments of the segmented electrode at at least one of: varying intensity and varying duty cycles.

* * * * *